United States Patent [19]
Douglas

[11] Patent Number: 5,943,089
[45] Date of Patent: Aug. 24, 1999

[54] METHOD AND APPARATUS FOR VIEWING AN OBJECT AND FOR VIEWING A DEVICE THAT ACTS UPON THE OBJECT

[75] Inventor: Stephen B. Douglas, Boxborough, Mass.

[73] Assignee: Speedline Technologies, Inc., Franklin, Mass.

[21] Appl. No.: 08/702,163

[22] Filed: Aug. 23, 1996

[51] Int. Cl.⁶ .................................................. H04N 7/18
[52] U.S. Cl. ............................ 348/87; 348/95; 348/129; 348/190; 382/151; 356/401
[58] Field of Search .................................. 348/86–87, 90, 348/92, 94–95, 125, 126, 129–130, 180, 189, 190; 382/151, 294; 356/399–401; 29/739–740, 833; 324/758; H04N 7/18

[56] References Cited

U.S. PATENT DOCUMENTS

| | | | |
|---|---|---|---|
| Re. 34,615 | 5/1994 | Freeman | 348/87 |
| 3,317,662 | 5/1967 | Robinson et al. | 250/226 |
| 3,355,979 | 12/1967 | Wirtanen | 356/399 |
| 3,684,384 | 8/1972 | Hojo et al. | 356/154 |
| 3,752,589 | 8/1973 | Kobayashi | 156/345 |
| 3,937,579 | 2/1976 | Schmidt | 355/30 |
| 3,988,535 | 10/1976 | Hickman et al. | 364/559 |
| 4,070,117 | 1/1978 | Johannsmeier et al. | 250/237 R |
| 4,126,376 | 11/1978 | Gommel et al. | 356/399 |
| 4,160,263 | 7/1979 | Christy et al. | 348/87 |
| 4,295,153 | 10/1981 | Gibson | 348/360 |
| 4,342,090 | 7/1982 | Caccoma et al. | 29/407.04 |
| 4,376,584 | 3/1983 | Hart et al. | 365/243 |
| 4,377,028 | 3/1983 | Imahashi | 250/237 G |
| 4,385,838 | 5/1983 | Nakazawa et al. | 250/491.1 |
| 4,404,741 | 9/1983 | Lebet et al. | 29/740 |
| 4,406,546 | 9/1983 | Suzuki | 356/400 |
| 4,437,603 | 3/1984 | Kobayashi et al. | 29/850 |
| 4,481,533 | 11/1984 | Alzmann et al. | 356/396 |
| 4,494,139 | 1/1985 | Shima | 348/87 |
| 4,496,970 | 1/1985 | Schorcht et al. | 348/87 |
| 4,518,862 | 5/1985 | Dorn | 356/375 |
| 4,537,509 | 8/1985 | Kronfeld | 33/276 |
| 4,599,000 | 7/1986 | Yamada | 356/400 |
| 4,608,494 | 8/1986 | Kobayashi et al. | 29/721 |
| 4,614,431 | 9/1986 | Komeyama | 356/400 |
| 4,628,464 | 12/1986 | McConnell | 29/721 |
| 4,639,878 | 1/1987 | Day et al. | 348/94 |
| 4,641,257 | 2/1987 | Ayata | 348/87 |
| 4,643,579 | 2/1987 | Toriumi et al. | 348/95 |
| 4,651,203 | 3/1987 | Peterson | 356/399 |
| 4,655,600 | 4/1987 | Tanigawa | 348/95 |

(List continued on next page.)

FOREIGN PATENT DOCUMENTS

WO 95/14575  6/1995  WIPO ............................ B41F 33/00

OTHER PUBLICATIONS

IBM Technical Disclosure C.A., Gaston, *Alignment Beamsplitter Cube*, Oct. 1982.

*Primary Examiner*—Vu Le
*Attorney, Agent, or Firm*—Mintz, Levin, Cohn, Ferris, Glovsky and Popeo, P.C.

[57] ABSTRACT

Embodiments of the present invention are directed to a video probe for viewing an object and for viewing a device that acts on the object. In one embodiment, the video probe includes a first viewing channel having a viewing direction along a first optical axis to provide an image of the object, a second viewing channel having a viewing direction along a second optical axis that is substantially parallel to the first optical axis, and wherein the viewing direction of the second channel is substantially the same as the viewing direction of the first viewing channel, and an imaging system to receive the image of the object and the image of the device from the first and second viewing channels. Embodiments of the present invention are also directed to a method and apparatus for printing a pattern on a substrate using a printing screen having the pattern defined thereon. A video probe is used to view the printing screen and the substrate prior to printing to provide image signals which are used to properly align the printing screen with the substrate prior to printing.

23 Claims, 6 Drawing Sheets

U.S. PATENT DOCUMENTS

| | | | |
|---|---|---|---|
| 4,667,109 | 5/1987 | Kano | 250/458.1 |
| 4,669,883 | 6/1987 | Ina et al. | 250/548 |
| 4,672,209 | 6/1987 | Karasaki et al. | 250/461.1 |
| 4,672,676 | 6/1987 | Linger | 348/95 |
| 4,677,474 | 6/1987 | Sato et al. | 324/758 |
| 4,685,807 | 8/1987 | Picard | 356/399 |
| 4,724,480 | 2/1988 | Hecker et al. | 356/375 |
| 4,725,737 | 2/1988 | Nakata et al. | 250/557 |
| 4,738,025 | 4/1988 | Arnold | 29/740 |
| 4,757,550 | 7/1988 | Uga | 348/95 |
| 4,782,751 | 11/1988 | Colapinto | 101/129 |
| 4,794,648 | 12/1988 | Ayata et al. | 348/87 |
| 4,796,200 | 1/1989 | Pryor | 348/95 |
| 4,810,154 | 3/1989 | Klemmer et al. | 414/223 |
| 4,812,666 | 3/1989 | Wistrand | 250/559.29 |
| 4,823,394 | 4/1989 | Berkin et al. | 348/87 |
| 4,829,375 | 5/1989 | Alzmann et al. | 356/401 |
| 4,844,324 | 7/1989 | Todd | 29/743 |
| 4,853,771 | 8/1989 | Witriol et al. | 235/375 |
| 4,857,752 | 8/1989 | Hata et al. | 250/237 R |
| 4,868,683 | 9/1989 | Schulz | 348/95 |
| 4,899,921 | 2/1990 | Bendat et al. | 348/95 |
| 4,929,893 | 5/1990 | Sato et al. | 348/87 |
| 5,031,334 | 7/1991 | Takamura | 33/614 |
| 5,048,967 | 9/1991 | Suzuki et al. | 356/401 |
| 5,050,111 | 9/1991 | Ayata et al. | 348/87 |
| 5,060,063 | 10/1991 | Freeman | 348/95 |
| 5,062,565 | 11/1991 | Wood et al. | 228/102 |
| 5,100,237 | 3/1992 | Wittekoek et al. | 356/401 |
| 5,122,971 | 6/1992 | Kamejima | 348/95 |
| 5,132,911 | 7/1992 | Leader, Jr. et al. | 33/618 |
| 5,133,603 | 7/1992 | Suzuki et al. | 355/45 |
| 5,136,948 | 8/1992 | Fujino et al. | 33/621 |
| 5,145,432 | 9/1992 | Midland et al. | 348/95 |
| 5,157,734 | 10/1992 | Chen et al. | 348/87 |
| 5,181,823 | 1/1993 | Hussey et al. | 73/862.041 |
| 5,194,948 | 3/1993 | L'Esperante et al. | 348/87 |
| 5,204,739 | 4/1993 | Domenicali | 348/87 |
| 5,251,266 | 10/1993 | Spigarelli et al. | 29/271 |
| 5,305,099 | 4/1994 | Morcos | 348/95 |
| 5,410,532 | 4/1995 | Ohno et al. | 250/201.5 |
| 5,457,538 | 10/1995 | Ujiie | 348/87 |
| 5,471,310 | 11/1995 | Spigarelli et al. | 348/87 |
| 5,539,676 | 7/1996 | Yamaguchi | 382/151 |
| 5,721,607 | 2/1998 | Ota | 356/399 |

METHOD AND APPARATUS FOR VIEWING AN OBJECT AND FOR VIEWING A DEVICE THAT ACTS UPON THE OBJECT

FIELD OF THE INVENTION

The present invention relates in general to aligning an object with a device and more particularly to a novel apparatus and method for illuminating and viewing an object to be acted upon at particular locations and for illuminating viewing a device for acting upon the object.

BACKGROUND OF THE INVENTION

In high precision screen printers that use screens or stencils to print inks, solder pastes and other diverse media onto a substrate, such as a ceramic tape or a fiberglass circuit board, it is critical to align the stencil or screen with the substrate prior to the printing process so that the media is deposited onto the substrate in accurate alignment to datum features on the substrate. A screen printer incorporating a video probe for aligning a screen with a substrate is disclosed in re-issued U.S. Pat. No. 34,615 to Freeman, incorporated herein by reference. The disclosed screen printer includes a video probe that is inserted between a screen and a substrate to alternately view the screen and the substrate to provide alignment prior to printing.

Another prior art apparatus for aligning a screen with a substrate in a screen printer is disclosed in U.S. Pat. No. 5,060,063 to Freeman, incorporated herein by reference. The alignment system disclosed in U.S. Pat. No. 5,060,063 is shown in FIG. 1. This system includes a video probe 100 that is placed between a screen 104 and a substrate 102 to align the screen with the substrate. The video probe captures images of the substrate and the screen, and a computer control system is used to drive motor stages to align the screen to the substrate (or vice versa). The video probe 100 is then removed from between the screen and the substrate prior to printing, so that the screen may be disposed immediately over the substrate to allow for printing.

The video probe 100 has a housing 106 with a central viewing bore 108 having an optical axis 110 coaxial with a video camera 112. Housing 106 also has a viewing channel 114 having a central viewing axis 116 perpendicular to optical axis 110. An imaging beamsplitter 118 is centered at the intersection of the optical axis 110 and the viewing axis 116 so that the video camera may simultaneously view the object 102 and the device acting on the object 104. An object illuminating beamsplitter 124 is disposed in the viewing channel 114 between the viewing beamsplitter 118 and the substrate 102 to direct illumination toward the substrate along the viewing axis 116. Similarly, a device illuminating beamsplitter 126 is disposed in the viewing channel between the viewing beamsplitter and the screen 104 to direct illumination toward the screen along the viewing axis.

Separate fiber optic light sources 128 and 130 supply light to illuminating beamsplitters 124 and 126 respectively. Each fiber optic source terminates in a closed cavity 132, 134 and illuminates a light disperser 136, 138 adjacent to the respective illuminating beamsplitter 124, 126. Each disperser produces an even white tone across the adjacent face of the illuminating beamsplitter, which in turn produces a uniform illumination of the object or the device.

In the apparatus shown in FIG. 1, an object image travels along the viewing axis 116 through the beamsplitter 124 and is directed by the imaging beamsplitter 118 along the optical axis 110 to the viewing camera 112. Similarly, a device image travels along the viewing axis 116 through the beamsplitter 126 and is directed by the imaging beamsplitter along the optical axis to the viewing camera. Based on the object and device images received by the camera, either the object or the device can be moved to bring the object and the device into proper alignment for printing.

In typical prior art devices, a minimum of two fiducial marks on the screen and on the substrate are used to provide alignment. Thus, the video probe is moved to at least two locations, and is then removed from between the screen and the substrate, before printing begins.

SUMMARY OF THE INVENTION

It is an object of the present invention, to provide an improved alignment system having a video probe that significantly reduces the time required to align a screen with a substrate prior to printing.

In a first embodiment of the present invention, a viewing probe for viewing an object and a device that acts upon the object includes a first viewing channel having a viewing direction along a first optical axis to provide an image of the object, a second viewing channel having a viewing direction along a second optical axis that is substantially parallel to the first optical axis, wherein the viewing direction of the second channel is substantially the same as the viewing direction of the first viewing channel, and an imaging system to receive the image of the object and the image of the device from the first and second viewing channels.

In a preferred embodiment of the video probe, the first viewing channel has a beamsplitter disposed on the first optical axis to direct the object image along a third optical axis, and the second viewing channel has a beamsplitter disposed on the second optical axis to direct the device image along the third optical axis. In the preferred embodiment, the viewing system includes a fourth optical axis perpendicular to the third optical axis, and an image reflector disposed on an intersection of the third optical axis and the fourth optical axis to direct the object image and the device image along the fourth optical axis.

In another embodiment of the video probe, the video probe further includes a third viewing channel having a viewing direction along a fifth optical axis to provide a second image of the object and a fourth viewing channel having a viewing axis along a sixth optical axis to provide a second image of the device. The fifth and sixth optical axes are substantially parallel to the first optical axis.

Another embodiment of the present invention is directed to a printer for printing a pattern on a substrate. The printer includes a screen having the pattern disposed thereon, a video probe that views the screen and the substrate, and a control system that detects an error in alignment of the screen and the substrate, and provides relative movement of the screen and substrate based on the error detected to align the screen with the substrate. The video probe includes a first viewing channel having a viewing direction along a first optical axis to provide an image of the object, a second viewing channel having a viewing direction along a second optical axis that is substantially parallel to the first optical axis, and wherein the viewing direction of the second channel is substantially the same as the viewing direction of the first viewing channel, and an imaging system to receive the image of the object and the image of the device from the first and second viewing channels.

In yet another embodiment of the present invention, a method of printing a pattern on a substrate using a printing screen is provided. The method includes steps of placing the substrate beneath the printing screen, positioning a video probe beneath the substrate in a first position, capturing a first image of the substrate and of the printing screen, capturing a second image of the substrate and of the printing screen, generating an error signal indicative of a misalignment of the printing screen and the substrate, relatively moving the printing screen and the substrate, and printing the pattern on the substrate.

In another embodiment of the present invention, a printer for printing a pattern on a substrate includes a printing screen, a support structure to support the substrate beneath the printing screen, means for capturing a first image of the printing screen and a first image of the substrate, means for capturing a second image of the printing screen and a second image of the substrate and a control system that detects an error in alignment of the screen and the substrate, and provides relative movement of the printing screen and the substrate based on the error detected to align the printing screen with the substrate. In one embodiment, the printer further includes means for capturing a second image of the substrate and a second image of the screen.

BRIEF DESCRIPTION OF THE DRAWINGS

In the drawings, which are incorporated herein by reference and in which like elements have been given like reference characters.

DETAILED DESCRIPTION

For purposes of illustration only, and not to limit generality, the present invention will now be explained with reference to a screen printer that uses a screen or a stencil to print ink, solder paste, or some other media on to a substrate such as a circuit board. One skilled in the art will appreciate, however, that embodiments of the present invention are not limited to screen printers, but rather, the viewing apparatus of the present invention may be used in other applications requiring the alignment of objects.

Figure 2:
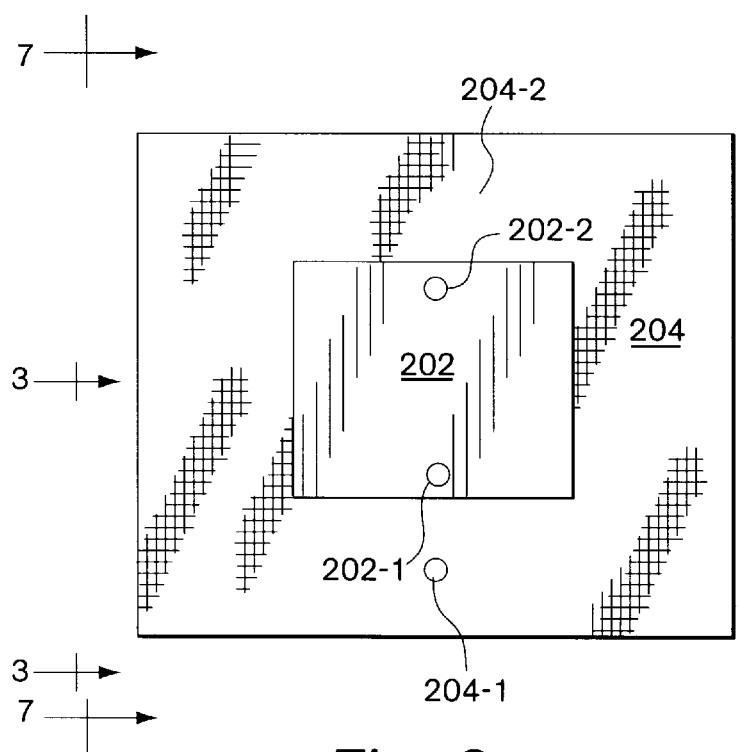
FIG. 2 is a bottom view of a screen and substrate as positioned in a screen printer prior to printing on the substrate.

Reference is now made to FIG. 2 wherein a bottom view of a circuit board 202 is shown disposed beneath a screen 204. The circuit board 202 and the screen 204 are shown in alignment as in a screen printer such that a pattern on the screen may be precisely printed in a proper location on the circuit board 202. The remaining components of the screen printer, other than the screen 204, are not shown in FIG. 2 for the sake of clarity. The screen 204 has fiducials 204-1 and 204-2, and the circuit board 202 has fiducials 202-1 and 202-2. As described below in further detail, these fiducials are used to properly align the screen with the board prior to printing. The fiducials 202-1, 202-2, 204-1 and 204-2 are all visible from the same side of the substrate, the bottom side, in the embodiment shown in FIG. 2.

Figure 3:
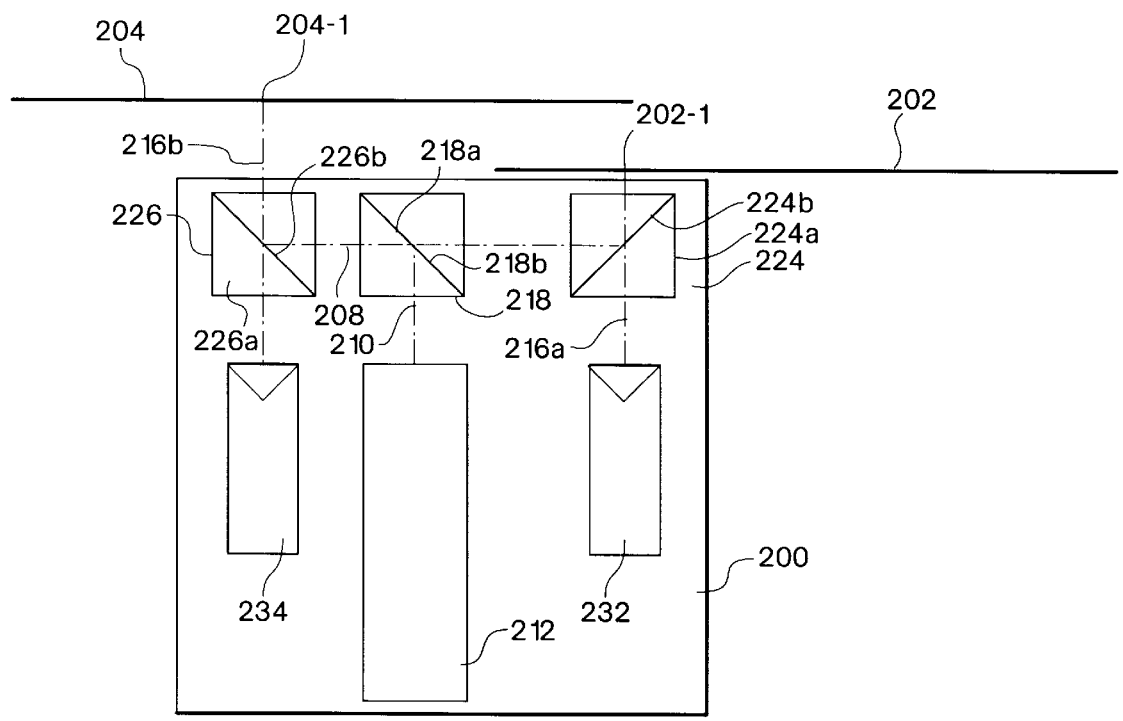
FIG. 3 is a video probe in accordance with one embodiment of the present invention.

FIG. 3 shows a partial side view of the screen 204 and the circuit board 202, taken along line 3—3 of FIG. 2, along with a viewing probe 200 used to align the circuit board with the screen.

The video probe 200 has a first viewing channel with a first optical axis 216b shown in alignment with one of the fiducials 204-1 of the screen 204, and the video probe has a second viewing channel with a second optical axis 216a shown in FIG. 3 in alignment with one of the fiducials 202-1 of the circuit board 202. The video probe 200 has a third optical axis 208 perpendicular to the first and second optical axes and a fourth optical axis 210 perpendicular to the third optical axis. A video camera 212 is arranged to receive images along the fourth optical axis. In a preferred embodiment, camera 212 is a charge-coupled device (CCD) available from Toshiba of Japan as part number 1IK-M41MR.

Light sources 232 and 234 respectively provide illumination along optical axes 216a and 216b. The light sources 232 and 234 in a preferred embodiment of the present invention are implemented using fiber optic light sources and light dispersers similar to the light sources of the prior art video probe shown in FIG. 1. As understood by those skilled in the art, other light sources capable of providing directional light along the first and second optical axes may be used as the light sources 232 and 234. Light from each of the light sources 232 and 234 is directed along the first and second optical axes 216a and 216b to direct a substantially solid plane of light onto objects to be viewed by the video probe 200 to prevent lighting voids in the reflection from the objects.

Video probe 200 includes illuminating beamsplitters 224 and 226. Beamsplitter 224 is disposed along the first optical axis 216a and beamsplitter 226 is disposed along the second optical axis 216b. Each of the illuminating beamsplitters 224 and 226, is similar to the illuminating beamsplitter 22 of referenced U.S. Pat. No. 5,060,063 (see FIG. 1). Each of the illuminating beamsplitters is formed from two mating prism-shaped pieces. Beamsplitter surfaces 224b and 226b are formed by coating one of the mating surfaces of the prism-shaped pieces with a low loss 50% light reflective/50% light transmissive optical material. Thus, light incident on the beamsplitter surface is half transmitted through the surface and half reflected by the surface. Other transmission/reflection ratios may be used dependent on the relative light transmission desired. Faces 226a and 224a of beamsplitters 226 and 224 are covered with an opaque, light absorbing coating to absorb light reflected from the beamsplitter surfaces 224b and 226b. In a preferred embodiment, the illuminating beamsplitters 224 and 226 are implemented using an optical glass cube consisting of two cube halves available from Precision Optics Corporation, 22 East Broadway, Gardner, Mass. 01440, as part numbers 8280-602 and 8280-603.

Video probe 200 further includes an imaging beamsplitter 218. The imaging beamsplitter is substantially identical to the imaging beamsplitter 118 of the prior art video probe shown in FIG. 1. The imaging beamsplitter has a planar beamsplitting surface 218b which internally traverses the beamsplitter cube to bisect the image beamsplitter into two prism-shaped halves. The imaging beamsplitter is disposed at an intersection of the third optical axis 208 and the fourth optical axis 210 such that the center of the beamsplitting surface coincides with each of the optical axes. A typical optical class cube used for the imaging beamsplitter 218 is commercially available from Precision Optics Corporation as part numbers 8280-600 and 8280-601 for the cube halves that comprise the imaging beamsplitter.

Figure 4A:
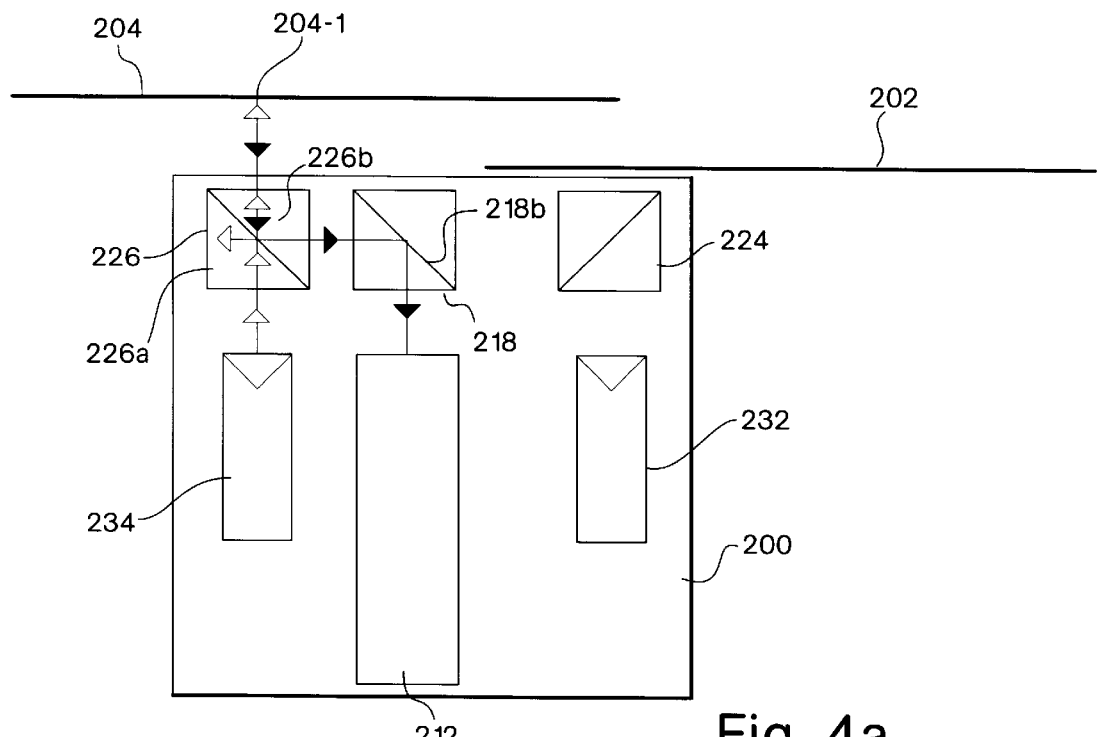
FIGS. 4a and 4b show optical paths through the embodiment of the invention shown in FIG. 3.

The optical paths from the light sources 232 and 234 and the optical paths through which the images travel through the video probe 200 to the camera 212 will now be described with reference to FIGS. 4a and 4b. In a preferred embodiment of the video probe shown in FIG. 3, the video camera 212 does not view fiducials 204-1 and 202-1 simultaneously, but rather, views them one at a time. This is accomplished by alternately turning on light sources 232 and 234. FIG. 4a shows the optical paths through the video probe 200 with light source 234 on and with light source 232 off. In the figures, the unshaded or white arrows are used to designate the path that the light from the illuminating sources follows, and the darkened arrows are used to indicate the path by which the images of the fiducials travel to the camera. As shown in FIG. 4a, light from illuminating source 234 impinges on beamsplitting surface 226b. Half of the light passes through beamsplitter surface 226b and impinges on the fiducial 204-1. The other half of the light that impinges on the beamsplitter surface 226b is reflected from the beamsplitter surface and is absorbed by the opaque surface 226a of illuminating beamsplitter 226. The image of the screen fiducial 204-1 is partially reflected by the beamsplitter surface 226b and partially transmitted through the beamsplitter surface. The portion reflected is again reflected by beamsplitter surface 218b of imaging beamsplitter 218 and directed towards camera 212.

Figure 4B:
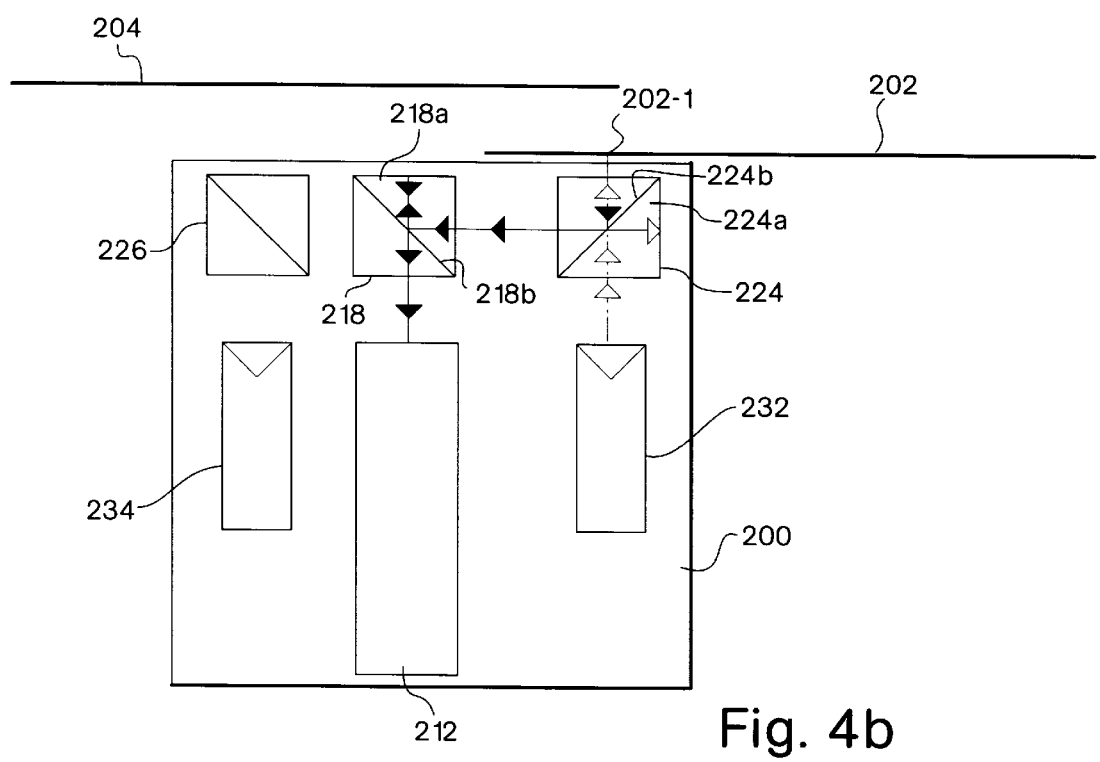

In a similar fashion, as shown in FIG. 4b, with illuminating source 234 off and illuminating source 232 on, light from source 232 impinges on beamsplitter surface 224a, and is partially transmitted through the beamsplitter surface and is partially reflected from the beamsplitter surface. The portion of the light reflected is absorbed by the opaque surface 224a of beamsplitter 224. The portion of the light transmitted through beamsplitter surface 224b impinges on fiducial 202-1. A circuit board image is partially reflected from beamsplitter surface 224b and is partially transmitted through beamsplitter surface 224b. The portion of the image that is reflected from beamsplitter surface 224b is partially reflected from beamsplitter surface 218b and is partially transmitted through beamsplitter surface 218b. The portion of the image that is reflected from beamsplitter surface 218b impinges on the mirror surface 218a and is reflected towards the camera 212 along the fourth optical axis 210.

Although the video probe is described above as being operated by illuminating only one of the illuminating sources 234 and 232 at a time, in another embodiment, both illuminating sources may be turned on to simultaneously view the screen and the circuit board.

For proper operation of the video probe 200, the camera 212 focuses simultaneously on the screen 204 and the circuit board 202. As shown in FIG. 3, the distance between illuminating beamsplitter 226 and the imaging beamsplitter 218 is not the same as the distance between illuminating beamsplitter 224 and the imaging beamsplitter 218. The greater distance between illuminating beamsplitter 224 and the imaging beamsplitter 218 is used to equalize the path length that the screen image and the circuit board image must travel to the camera 212. As shown in FIG. 3, there is a greater distance between the screen 204 and the imaging beamsplitter 226 than between the circuit board 202 and the beamsplitter 224. The distance between beamsplitters 218 and 224 is adjusted to match this difference in distance. Further, as seen by comparing FIGS. 4a and 4b, the circuit board image travels a distance in the imaging beamsplitter 218 that is greater than the distance traveled by the screen image in the imaging beamsplitter. In a preferred embodiment of the present invention, to provide greater precision, the size of illuminating beamsplitter 226 may be increased to increase the portion of the screen image optical path that passes through glass to equal the portion of the circuit board image optical path that travels through glass.

Figure 5:
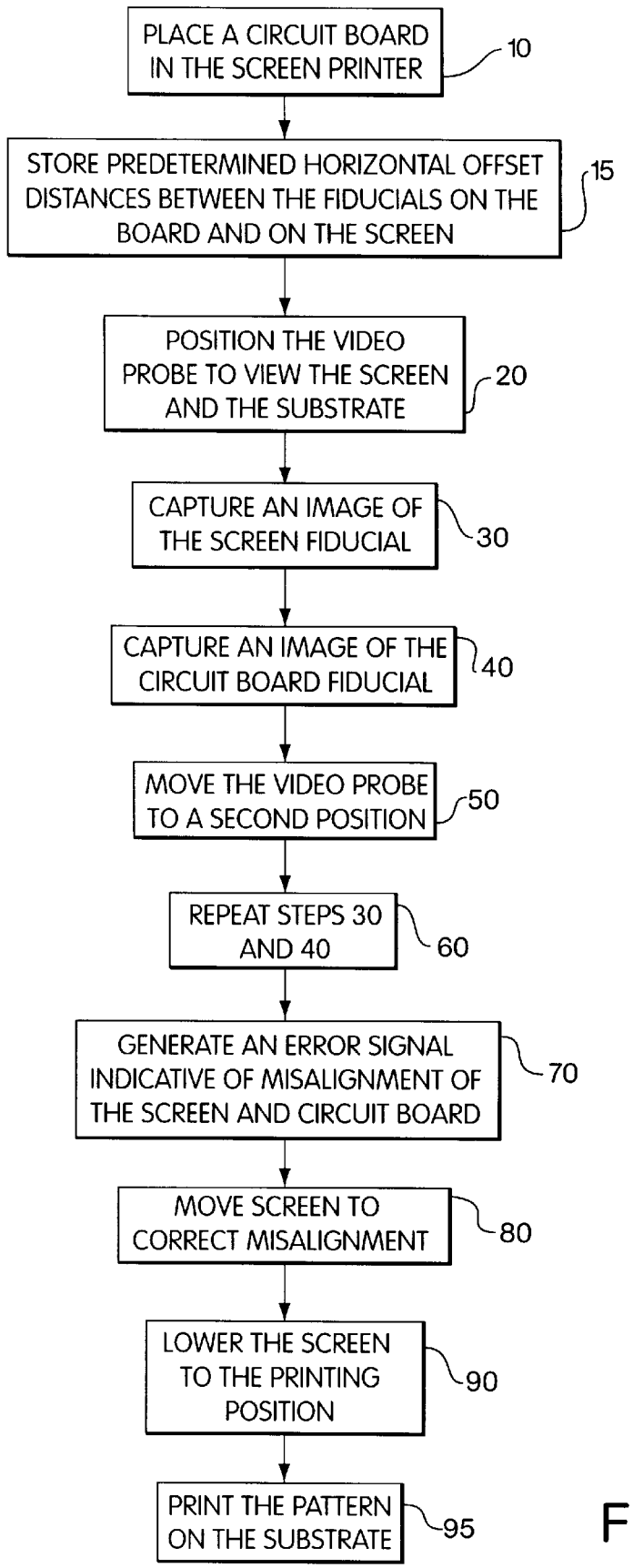
FIG. 5 provides a flow chart of a method of screen printing using the embodiment of the invention shown in FIG. 3.

A method for printing a pattern of deposited material on the circuit board 202 using the video probe 200 to align the circuit board with the screen of a screen printer will now be described with reference to FIG. 5. FIG. 5 shows a flow chart of the process by which a media is printed on a circuit board using a screen printer having an alignment system in accordance with one embodiment of the present invention. A substrate, such as a circuit board, to be printed upon is first loaded into the screen printer (step 10). Predetermined horizontal offset distances between fiducials on the circuit board and fiducials on the screen are preloaded into a computer control system of the screen printer (step 15). The video probe is then positioned to capture an image of a fiducial on the screen, and an image of a fiducial on the circuit board (step 20). In step 30, an image is obtained of the screen 204, and in step 40, an image is obtained of the circuit board.

The video probe is then positioned to view a second fiducial of the screen and a second fiducial of the circuit board (step 50). In a preferred embodiment of a screen printer incorporating the video probe shown in FIG. 3, the screen printer utilizes a stepper motor drive to move the probe to different positions beneath the circuit board. Steps 30 and 40 are then repeated for the second set of fiducials (step 60). Based on the images obtained in steps 30 through 60 and the predetermined horizontal offset distances, an error signal is generated in step 70 by the computer control system. The error signal indicates an amount of error in the alignment of the screen and board.

In step 80, the screen is moved to correct the misalignment. In step 90, the stencil is lowered to the proper height above the circuit board for printing, and in step 95 the actual printing occurs.

In the operation of the screen printer described with reference to FIG. 5, the screen is moved while the circuit board is held stationary to provide proper alignment of the screen with the substrate. As understood by those skilled in the art, the circuit board, or both the circuit board and the screen, could be moved based on the error signal generated by the computer control system.

In a preferred embodiment, two video probes are included within a screen printer. The use of two video probes enables both sets of fiducials to be aligned simultaneously to greatly reduce the printing cycle time of the screen printer. Further, the use of two video probes allows each of the video probes to be fixed in place, requiring less movable parts, and thereby increasing reliability of the vision system. As understood by those skilled in the art, where greater precision in alignment is required, it may be desirable to use screens and circuit boards having more than two sets of fiducials. In this situation, additional video probes may be included in the screen printer such that there is one video probe for each set of fiducials.

Figure 6:
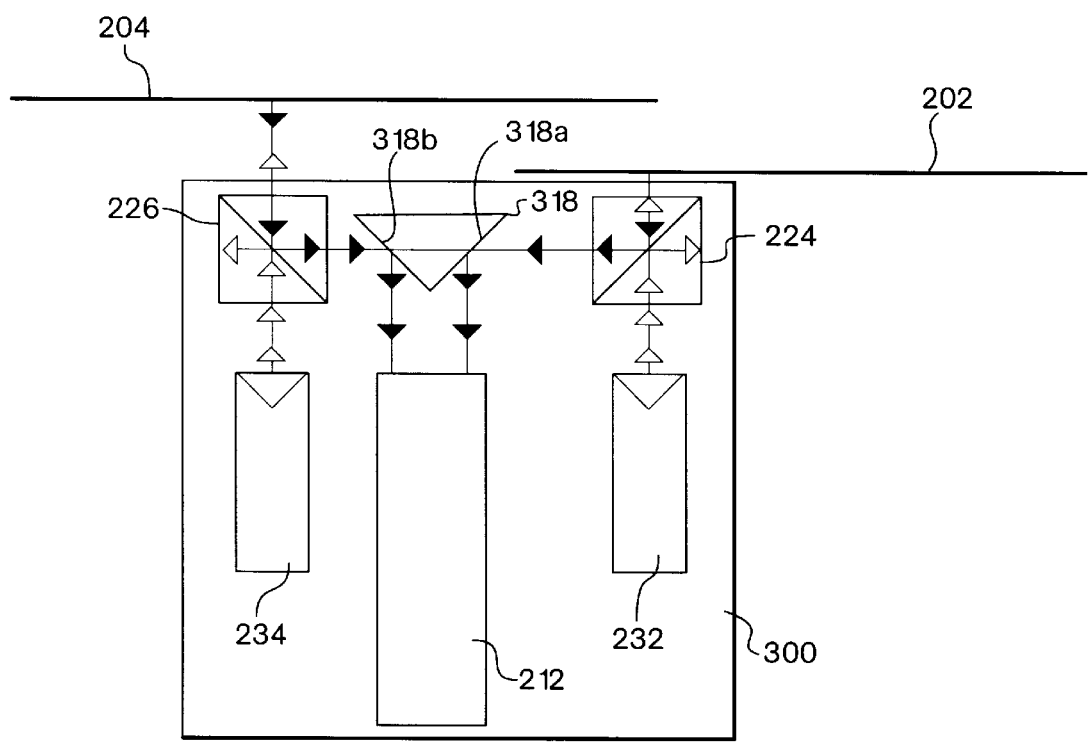
FIG. 6 is a video probe in accordance with a second embodiment of the present invention.

A second embodiment of the present invention will now be described with reference to FIG. 6 which shows a video probe 300 disposed beneath the screen 204 and the circuit board 202 in a similar manner to the video probe 200 of FIG. 2. Common elements of the video probe 300 of FIG. 6 with that of the video probe 200 of FIG. 2 use the same reference numbers. Video probe 300 is similar to video probe 200 except that the imaging beamsplitter 218 of the video probe 200 has been replaced by a glass reflector 318 having reflecting surfaces 318a and 318b. Each of the reflecting surfaces 318a and 318b are formed on a diagonal plane of the reflector. As shown in FIG. 6, the glass reflector 318 is positioned such that the midpoint of each of the beamsplitter surfaces 224a and 226a of the illuminating beamsplitters are respectively in horizontal alignment with the midpoint of each of the reflecting surfaces 318a and 318b.

In the video probe 300, the screen image is reflected by surface 318b of glass reflector 318 towards the camera 212 and the substrate image is reflected by surface 318a of glass reflector 318 toward the camera 212. Separate images of the screen and board are thus formed on the CCD array of camera 212. Since the images are formed adjacent to one another, a single image acquired by the camera 212 consists of adjacent images of the screen and the circuit board.

The video probe 300 allows the camera 212 to simultaneously capture a screen image and a circuit board image, thus obviating the need to alternately power on light sources 232 and 234 and reducing the time required to align the screen with the circuit board.

Figure 7:
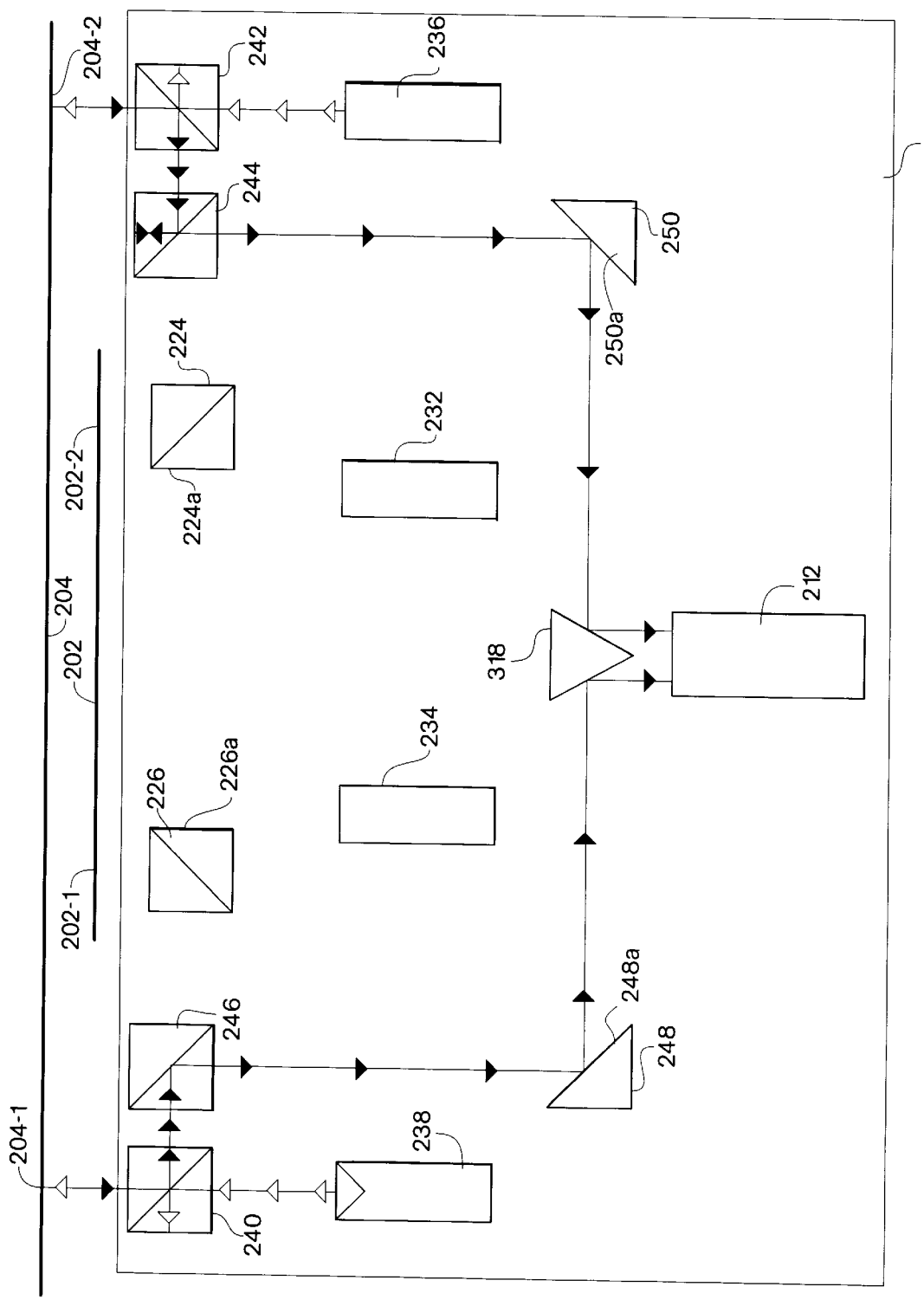
FIG. 7 is a video probe in accordance with a third embodiment of the present invention.

A third embodiment of the present invention will now be described with reference to FIG. 7. FIG. 7 shows a side view of the circuit board 202 and the screen 204 of FIG. 2 taken along line 7—7 with a video probe 400 disposed beneath the circuit board. In the embodiment shown in FIG. 7, the video probe 400 has four viewing channels to view two fiducials on the board 204 and two fiducials on the substrate 202 without requiring motion of the video probe. Common elements of the video probe 400 of FIG. 6 with video probes 200 and 300 use the same reference numbers.

Video probe 400 is similar to video probe 300 in that a reflector 318 is used to simultaneously reflect two images onto the CCD array of the camera 212. In comparison with video probe 300, video probe 400 has two additional illuminating beamsplitters 240 and 242, two additional illuminating sources 236 and 238, two additional imaging beamsplitters 246 and 244, and two corner reflectors 248 and 250. Further, illuminating beamsplitters 226 and 224 are rotated in video probe 400 with respect to their position in video probe 300 to direct images to respectively imaging beamsplitters 244 and 246.

The illuminating beamsplitters 240 and 242 are equivalent to the illuminating beamsplitters 224 and 226 described above. Illuminating sources 236 and 238 are equivalent to illuminating sources 232 and 234 described above, and imaging beamsplitters 244 and 246 are equivalent to illuminating beamsplitter 218 described above. Corner reflectors 248 and 250 are formed from a glass prism and have reflective surfaces 248a and 250a.

Video probe 400 may be used to simultaneously view four fiducials by powering on all four light sources simultaneously. In this situation, one half of the CCD array in camera 212 will receive overlapping images corresponding to fiducials 202-1 and 204-1 and the other half of the CCD array will receive images corresponding to fiducials 202-2 and 204-2. In a preferred operation of the video probe 400, one of illuminating sources 234 and 238 and one of illuminating sources 232 and 236 are powered on simultaneously to locate two of the fiducials, and then the other two light sources are turned on to locate the other two fiducials. In FIG. 7, the optical paths through the video probe 400 are shown with light sources 236 and 238 simultaneously turned on. The additional illuminating beamsplitters 240 and 242 of the video probe 400 are used to direct the images of fiducials 204-1 and 204-2 to the camera 212. As understood by those skilled in the art, alternatively, fiber optic techniques could be used in place of the beamsplitters to direct the images to the camera 212.

As with video probe 200 described above, for proper operation of video probe 400, the camera 212 focuses simultaneously on the screen 204 and the circuit board 202, and the elements of the video probe 400 are appropriately positioned to maintain equivalent optical path lengths from the fiducials to the camera 212.

The embodiment shown in FIG. 400 allows viewing of four fiducials (two on the screen, and two on the substrate) with only one location of the video probe 400 and using only one camera 212. This greatly reduces the printing cycle time of the screen printer, since no movement of the video probe is required.

The video probes in accordance with embodiments of the present invention described above can be adapted to fit into different space envelopes of screen printers. The camera 212 is typically the longest component (in the vertical direction as shown in FIGS. 3, 6 and 7) of the video probe, and may require the length of the video probe in a direction perpendicular to the screen 204 to be larger than desired. In embodiments of the present invention, the camera 212 and the image beamsplitter 218 (or reflector 318 for the embodiments of the invention using a split screen) can be rotated about the first optical axis 208 by 90° such that the longest dimension of the camera 212 is parallel to the plane defined by the surface of the screen 204.

In embodiments of the present invention, the video probes have been described as viewing fiducials on the screen 204 and the substrate 202. As understood by those skilled in the art, the fiducials can be one of many types of reference marks or known patterns on the screen and circuit board that can be detected by the camera 212. Further, in embodiments of the present invention, the camera 212 may detect a corner of the circuit board or the screen instead of detecting an actual fiducial.

The fiducials on the substrate 202 and on the screen 204 in a preferred embodiment of the present invention must be visible from the bottom side of the board and the bottom side of the screen as the vision system is typically placed below the circuit board in the screen printer. The screen is typically larger than the circuit board (as shown in FIG. 2), and is placed above the circuit board, and the circuit board is not visible from above. Where transparent or translucent circuit boards are used, the reference marks or fiducials may be located on the top of the circuit board as long as the video probe can detect the fiducial through the transparent or translucent circuit board. In embodiments of the invention, one fiducial of the circuit board and one fiducial of the screen must be visible to the camera at the same time.

As described above, the vision system in a preferred embodiment of the present invention is placed below the screen. The screen is typically larger than the circuit board (as shown in FIG. 2), and the screen is placed above the circuit board, so that the circuit board is not visible from above, and thus, the vision system is placed below the circuit board to view both the circuit board and the screen. As understood by those skilled in the art, in applications in which the circuit board, or some other substrate, is larger than the screen, the video probe may be placed above the screen and the circuit board. The present invention is not limited to video probes located below an object and device to be aligned, but rather, the vision system may be located in any position with respect to the device and the object from which both the device and the object may be viewed.

Figure 1:
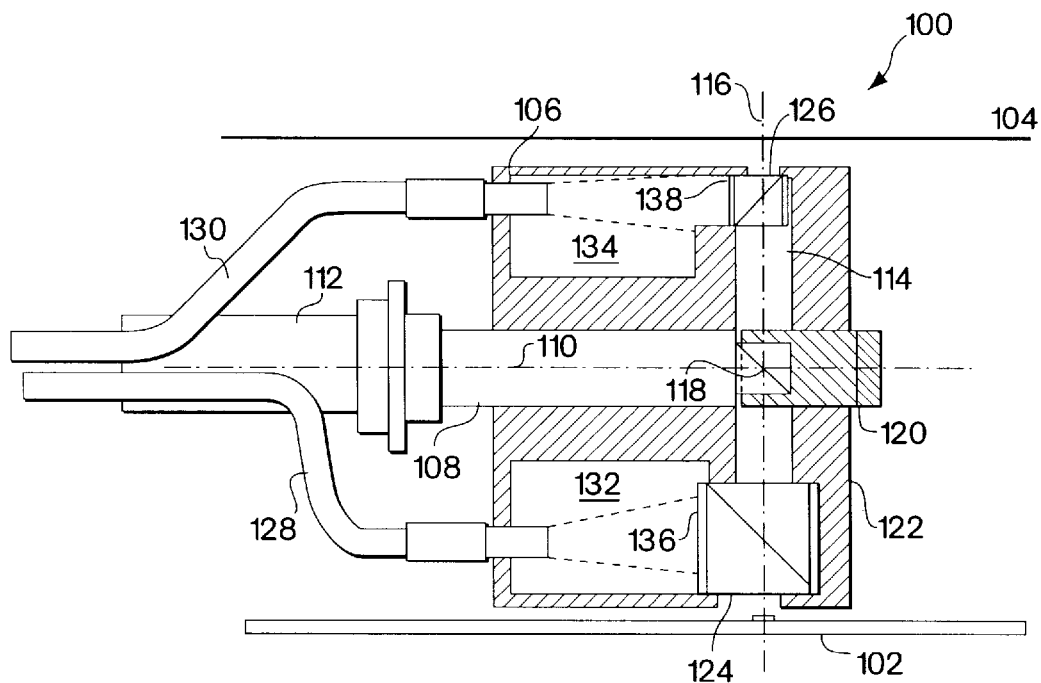
FIG. 1 is a diagram of a video probe in accordance with the prior art.

Embodiments of the present invention provide significant reduction in printing cycle times over the prior art system shown in FIG. 1, as there is little or no movement required of the vision probe to align the screen with a substrate. Further, the vertical distance between the screen and the substrate during the alignment process is significantly less than in the prior art system shown in FIG. 1. This reduces the time required to lower the screen to the substrate prior to printing on the substrate, and since the vertical distance traveled is reduced over the prior art, overall system precision is improved. Further, since there is less movement of the vision probes, system reliability is also enhanced.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is to find only in the following claims and the equivalents thereto.

What is claimed is:

1. A video probe for viewing an object and for viewing a device that acts on the object, the video probe comprising:
    a first viewing channel having a viewing direction towards the object along a first optical axis to provide an image of the object;
    a second viewing channel having a viewing direction towards the device along a second optical axis to provide an image of the device, wherein the second optical axis is parallel to the first optical axis, and wherein the viewing direction of the second channel is the same as the viewing direction of the first viewing channel;
    an imaging system connected to the first and second viewing channels to receive the image of the object and the image of the device from the first and second viewing channels; and
    an illumination system, coupled to the first and second viewing channels, that provides illumination of the object along the first optical axis and provides illumination of the device along the second optical axis;
    wherein the first viewing channel has a beamsplitter disposed on the first optical axis to direct the object image along a third optical axis, and wherein the second viewing channel has a beamsplitter disposed on the second optical axis to direct the device image along the third optical axis;
    wherein the viewing system includes:
        a fourth optical axis perpendicular to the third optical axis; and
        an image reflector disposed on the fourth optical axis to direct the object image and the device image along the fourth optical axis.

2. The video probe of claim 1, wherein the image reflector is disposed at an intersection of the third optical axis and the fourth optical axis and includes an optical beamsplitter having a beamsplitting surface with a partially light-transmissive, partially light reflective coating.

3. The video probe of claim 2, wherein the imaging system includes a camera that simultaneously views the object image and the device image.

4. The video probe of claim 1, wherein the image reflector includes:
    a first reflecting surface to reflect the image of the object along the fourth optical axis; and
    a second reflecting surface to reflect the image of the device along the fourth optical axis.

5. The video probe of claim 4, wherein the imaging system includes a camera and wherein the object image and the device image are formed adjacent one another within the camera.

6. The video probe of claim 4, further comprising:
    a third viewing channel having a viewing direction along a fifth optical axis to provide a second image of the object; and
    a fourth viewing channel having a viewing direction along a sixth optical axis to provide a second image of the device;
    wherein the fifth optical axis and the sixth optical axis are substantially parallel to the first optical axis.

7. The video probe of claim 1, wherein the device is a printing screen and the object is a substrate to be printed upon using the printing screen.

8. A video probe for viewing an object and for viewing a device that acts on the object, the video probe comprising:
    a first viewing channel having a viewing direction towards the object along a first optical axis to provide an image of the object;
    a second viewing channel having a viewing direction towards the device along a second optical axis to provide an image of the device, wherein the second optical axis is parallel to the first optical axis, and wherein the viewing direction of the second channel is the same as the viewing direction of the first viewing channel;
    an imaging system connected to the first and second viewing channels to receive the image of the object and the image of the device from the first and second viewing channels;
    a third viewing channel having a viewing direction along a third viewing axis to provide a second image of the object; and
    a fourth viewing channel having a viewing direction along a fourth optical axis to provide a second image of the device;
    wherein the third optical axis and the fourth optical axis are substantially parallel to the first optical axis.

9. A printer for printing a pattern on a substrate, the printer comprising:
    a screen having the pattern disposed thereon;
    a support structure that supports the screen and the substrate;
    a video probe, supported by the support structure, that views the screen and the substrate, the video probe including;
        a first viewing channel having a viewing direction along a first optical axis to provide an image of the substrate;
        a second viewing channel having a viewing direction along a second optical axis to provide an image of the screen, wherein the viewing direction of the second viewing channel is the same as the viewing direction of the first viewing channel;
        an imaging system connected to the first and second viewing channels to receive the image of the substrate and the image of the screen from the first and second viewing channels; and
    a control system, coupled to the video probe, that detects an error in alignment of the screen and the substrate, and provides movement of at least one of the screen and the substrate based on the error detected to align the screen with the substrate;

wherein the video probe further includes an illumination system, coupled to the first and second viewing channels, that provides illumination of the substrate along the first optical axis and the provides illumination of the screen along the second optical axis;

wherein the first viewing channel has a beamsplitter disposed on the first optical axis to direct the substrate image along a third optical axis and wherein the second viewing channel has a beamsmlitter disposed on the second optical axis to direct the screen image along the third optical axis; and wherein the viewing system further includes:
 a fourth optical axis perpendicular to the third optical axis; and
 an image reflector disposed on the fourth optical axis to direct the substrate image and the screen image along the fourth optical axis.

10. The printer of claim 9, wherein the image reflector is disposed at an intersection of the third optical axis and the fourth optical axis and includes an optical beamsplitter having a beamsplitting surface with a partially light-transmissive, partially light reflective coating.

11. The printer of claim 9, wherein the image reflector includes:
 a first reflecting surface to reflect the image of the substrate along the fourth optical axis; and
 a second reflecting surface to reflect the image of the screen along the fourth optical axis.

12. The printer of claim 11, wherein the imaging system includes a camera and wherein the substrate image and the screen image are formed adjacent one another within the camera.

13. The printer of claim 11, wherein the video probe further includes:
 a third viewing channel having a viewing direction along a fifth optical axis to provide a second image of the substrate; and
 a fourth viewing channel having a viewing direction along a sixth optical axis to provide a second image of the screen;
 wherein the fifth optical axis and the sixth optical axis are parallel to the first optical axis.

14. The printer of claim 9, wherein the imaging system includes a camera that simultaneously views the object image and the device image.

15. A printer for printing a pattern on a substrate, the printer comprising:
 a screen having the pattern disposed thereon;
 a support structure that supports the screen and the substrate;
 a video probe, supported by the support structure, that views the screen and the substrate, the video probe including;
  a first viewing channel having a viewing direction along a first optical axis to provide an image of the substrate;
  a second viewing channel having a viewing direction along a second optical axis to provide an image of the screen, wherein the viewing direction of the second viewing channel is the same as the viewing direction of the first viewing channel;
  an imaging system connected to the first and second viewing channels to receive the image of the substrate and the image of the screen from the first and second viewing channels; and a control system, coupled to the video probe, that detects an error in alignment of the screen and the substrate, and provides movement of at least one of the screen and the substrate based on the error detected to align the screen with the substrate;

wherein the video probe further includes:
 a third viewing channel having a viewing direction along a third optical axis to provide a second image of the substrate; and
 a fourth viewing channel having a viewing direction along a fourth optical axis to provide a second image of the screen;
wherein the third optical axis and the fourth optical axis are parallel to the first optical axis.

16. The printer of claim 15, further comprising:
 a substrate support connected to the support structure to support the substrate in a position below the screen; and
 wherein the video probe is disposed beneath the screen and the substrate.

17. The printer of claim 15, further comprising a second video probe, disposed beneath the screen and the substrate to view a second image on the substrate and a second image on the screen.

18. The printer of claim 17, wherein the control system moves the screen to align the screen with the substrate.

19. The printer of claim 17, wherein the control system moves the substrate to align the screen with the substrate.

20. A printer for printing a pattern on a substrate having a top side and a bottom side, the printer comprising:
 a printing screen having the printing pattern defined thereon, the printing screen having a top side and a bottom side;
 a support structure to support the substrate beneath the printing screen, such that a portion of the bottom side of the screen faces a portion of the top side of the substrate;
 means for capturing a first image of the bottom side of the printing screen and a first image of the bottom side of the substrate;
 means for capturing a second image of the bottom side of the printing screen and a second image of the bottom side of the substrate; and
 a control system, coupled to the means for capturing, that detects an error in alignment of the screen and the substrate, and provides relative movement of the screen and substrate based on the error detected to align the printing screen with the substrate.

21. The printer of claim 20, wherein the control system translates and rotates the screen to provide the relative movement.

22. The printer of claim 20, wherein the control system translates and rotates the substrate to provide the relative movement.

23. A printer for printing a pattern on a substrate having a first side and a second side, the printer comprising:
 a screen having the pattern disposed thereon, the screen having a first side and a second side;
 a support structure that supports the screen and the substrate such that at least a portion of the second side of the screen faces at least a portion of the first side of the substrate;
 a video probe, supported by the support structure, that views the second side of the screen and the second side of the substrate, the video probe including;
  a first viewing channel having a viewing direction along a first optical axis to provide an image of the second side of the substrate;

a second viewing channel having a viewing direction along a second optical axis to provide an image of the second side of the screen, wherein the viewing direction of the second channel is the same as the viewing direction of the first viewing channel;

an imaging system connected to the first and second viewing channels to receive the image of the substrate and the image of the screen from the first and second viewing channels; and a control system, coupled to the video probe, that detects an error in alignment of the screen and the substrate, and provides movement of at least one of the screen and the substrate based on the error detected to align the screen with the substrate.

* * * * *

UNITED STATES PATENT AND TRADEMARK OFFICE
CERTIFICATE OF CORRECTION

PATENT NO. : 5,943,089
DATED : August 24, 1999
INVENTOR(S) : Stephen B. Douglas

It is certified that error appears in the above-identified patent and that said Letters Patent is hereby corrected as shown below:

Claim 9, column 11, line 9, fifth word: "beamsmlitter", should be spelled, "beamsplitter."

Signed and Sealed this

Sixth Day of March, 2001

Attest:

NICHOLAS P. GODICI

Attesting Officer

Acting Director of the United States Patent and Trademark Office